United States Patent
Cava

Patent Number: 5,407,602
Date of Patent: Apr. 18, 1995

[54] TRANSPARENT CONDUCTORS COMPRISING GALLIUM-INDIUM-OXIDE

[75] Inventor: Robert J. Cava, Bridgewater, N.J.

[73] Assignee: AT&T Corp., Murray Hill, N.J.

[21] Appl. No.: 143,811

[22] Filed: Oct. 27, 1993

[51] Int. Cl.$^6$ .......... H01B 1/00; H01B 1/06; H01B 1/08

[52] U.S. Cl. ............ 252/518; 252/520; 423/624

[58] Field of Search ........... 252/518, 520; 423/624

[56] References Cited

U.S. PATENT DOCUMENTS

| | | | |
|---|---|---|---|
| 3,814,996 | 6/1974 | Enstrom et al. | 357/3 D |
| 3,895,131 | 7/1975 | Herbert | 427/226 |

FOREIGN PATENT DOCUMENTS

| | | | |
|---|---|---|---|
| 51-056998 | 5/1796 | Japan | |
| 60-65760 | 4/1985 | Japan | |

OTHER PUBLICATIONS

Shannon et al "Synthesis & Structure of Phases in the $In_2O_3$–$Ga_2O_3$ System" J. Inorg. Nucl. Chem. vol 30 pp. 1389–1398 1968.

Macdonald "Preparation & Crystal Chemistry of Some Mixed Metal Sesquioxides . . . " J. Inorg. Nucl. Chem. vol 29 pp. 661–671 1967.

Marezio "High–Pressure Phases of Indium Gallate (In-GaO$_3$) and Indium Oxide . . . " Collog. Int. Cent. nat. Rech. Sci. vol 188 1970 Abstract Only.

Marezio "Oxides at High Pressure" Trans. Amer. Crystallogr. Ass. vol 5 pp. 29–37 1969 Abstract Only.

*Primary Examiner*—Paul Lieberman
*Assistant Examiner*—M. Kopec
*Attorney, Agent, or Firm*—Glen E. Books

[57] ABSTRACT

Applicant has discovered that aliovalently doped gallium-indium-oxide (GaInO$_3$) can achieve electrical conductivity comparable to wide band-gap semiconductors presently in use while exhibiting enhanced transparency and improved index matching. The material can be doped to resistivity of less than 10 milliohm-cm by small quantities of aliovalent dopants, such as tetravalent atoms. It has a refractive index of about 1.6 and can be deposited on glass substrates in polycrystalline films.

11 Claims, 1 Drawing Sheet

TRANSPARENT CONDUCTORS COMPRISING GALLIUM-INDIUM-OXIDE

FIELD OF THE INVENTION

This invention relates to conducting materials and, in particular, to conducting materials comprising gallium-indium-oxide, $GaInO_3$, doped to exhibit electrical conductivity in a transparent state.

BACKGROUND OF THE INVENTION

Only a handful of materials provide the highly useful combination of electrical conduction and optical transparency. The earliest used materials were thin films of gold, silver and platinum used as electrodes on photoelectric cells. Wide band-gap semiconductor transparent electrodes including tin oxide coatings came into use during World War II (Nesa glass), and indium oxide coatings became commercially available in the 1970's. See G. Haacke, "Transparent Conducting Coatings", 7 *Ann. Rev. Mater. Sci.* 73-93 (1977).

Transparent conductive materials are important components in visual communications devices and useful in a variety of other applications. In modern liquid crystal displays, for example, arrays of transparent electrodes define the display segments or even pixels to be activated. Moreover transparent conductors can be used as antistatic coatings on instrument panels, heating elements on aircraft windows, and electrodes on solar cells. Such materials are also useful as heat retaining and ultraviolet light-rejecting coatings on windows.

One difficulty with presently available transparent conductive materials is their narrow transmission spectrum. They tend to absorb blue light in the visible spectrum and some tend even to absorb red light. For example, indium tin oxide, widely used because of its high conductivity, tends to absorb blue light and, as a consequence, appears yellow or green. Similar coloration is observed in a variety of wide band-gap semiconductor materials including zinc indium oxide and cadmium tin oxide. Such absorption requires higher power levels, limits choice in coloration, and presents an impediment to the development of full color flat panel displays. A second difficulty arises from the poor index of refraction match between indium tin oxide (ITO) (the most commonly used transparent conductor) and typical glasses. ITO coatings typically have an index of about 2.0 whereas typical glasses have an index of about 1.5. The result is reflection loss at the ITO/glass interface, reducing the amount of transmitted light. Accordingly, there is a need for transparent conductive material having enhanced transparency and better index matching with glass.

SUMMARY OF THE INVENTION

Applicant has discovered that aliovalently doped gallium-indium-oxide ($GaInO_3$) can achieve electrical conductivity comparable to wide band-gap semiconductors presently in use while exhibiting enhanced transparency and improved index matching. The material can be doped to resistivity of less than 10 milliohm-cm by small quantities of aliovalent dopants, such as tetravalent atoms. It has a refractive index of about 1.6 and can be deposited on glass substrates in polycrystalline films.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for the graphs, are not to scale.

DETAILED DESCRIPTION

A. Conductively Doped $GaInO_3$

Applicant has found that the conductivity of $GaInO_3$ is enhanced by small quantities of aliovalent dopants M in $GaIn_{1-x}M_xO_3$. (An aliovalent dopant is a dopant which has a valence different from the other atoms in the host compound). The aliovalent dopant should have a valence greater than 3 and preferably is tetravalent. In a series of experiments using $GaIn_{1-x}Sn_xO_3$ with $0.005 \leq x \leq 0.12$, it was determined that $GaIn_{0.94}Sn_{0.06}O_3$, for example, provided resistivity of 2 milliohm-cm in a 0.6 micrometer thick film. And, a similar series of experiments showed $Ga_{1-x}Ge_xInO_3$, $0.005 \leq x \leq 0.12$, to exhibit conductivity equivalent to $GaIn_{1-x}Sn_xO_3$ and visually similar transparency. $GaIn_{1-x}Ge_xO_3$ also gives good transparency and conductivity. Doping with Ti or Nb provided enhanced conductivity, but it was two orders of magnitude lower than the conductivity produced by tin. Doping with Si yielded similar results when Si was substituted for Ga. A series of experiments with $Ga_{1+x}In_{1-x-y}Sn_yO_3$ and $Ga_{1+x-y}Ge_yIn_{1-x}O_3$ for $0.25 \geq x$ and $0.005 \leq y \leq 0.12$ also showed conductivity and good transparency.

Figure 1:
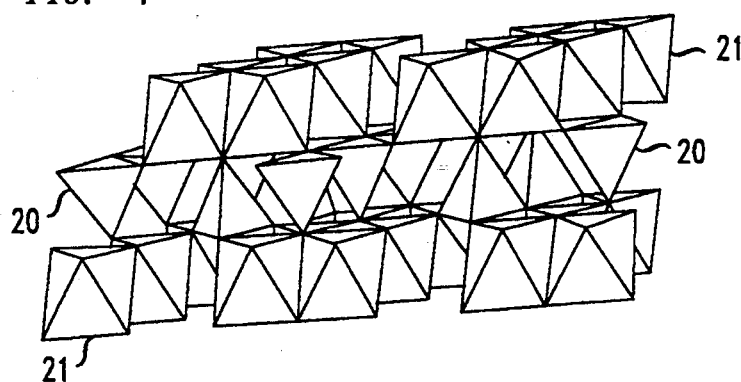
FIG. 1 is a polyhedral representation of $GaInO_3$.

FIG. 1 is a polyhedral representation of the crystal structure of $GaInO_3$. The metal atoms are in the centers of the polyhedra, and the oxygen atoms are at the corners. The tetrahedra 20 represent $GaO_4$ and the octahedra 21 represent $InO_6$.

$GaInO_3$ exhibits a $\beta$ gallia crystal structure similar to one of the forms of $Ga_2O_3$. In the $Ga_2O_3$ analog, Ga is present in two crystallographic metal sites: a four coordinate site and a six coordinate site. In $GaInO_3$, Ga is on the four coordinate site, and In is on the six coordinate site. As a consequence of this similarity, $GaInO_3$ can be mixed with $Ga_2O_3$ in a continuous range. $GaInO_3$ is conductively doped if it is doped to a resistivity of 10 milliohm-cm or less.

Methods for preparing conductively doped $GaInO_3$ can be understood by consideration of the following examples.

EXAMPLE 1

Powdered gallium oxide, $Ga_2O_3$, indium oxide, $In_2O_3$, and tin oxide, $SnO_2$, are weighed out to yield the appropriate mole ratios for $GaIn_{1-x}Sn_xO_3$. For instance, for a 5-gram total weight sample of $GaIn_{0.94}Sn_{0.06}O_3$, 2.0090 grams of $Ga_2O_3$, 2.7972 grams of $In_2O_3$ and 0.1938 grams of $SnO_2$ are used. The powders are mixed together and ground together in a mechanical mortar and pestle for a minimum of five minutes to insure good mixing and contact of powder particles. The mixed powders are transferred into high density aluminum oxide crucibles with cover and heated in air for an initial period of 12-15 hours at temperatures between 1100° and 1200° C. The resulting powders are then ground mechanically again, re-introduced into the covered aluminum oxide crucibles, and heated for a period of 12-15 hours at 1300° C. in air. After a third grinding, pellets are pressed in a standard steel dye (typically to a load of 3000 pounds for a half-inch diameter pellet). The pellets are then heated again at 1300° C. in air for a period of up to 60 hours. Pellets are typically placed on powder of their own composition inside the covered aluminum oxide crucibles for the pellet firing step. The pellets are cooled after this heating step at the natural cooling rate of the furnace, which in our case results in reaching 300° C. in approximately three hours, at which point the pellets are removed from the furnace. The resulting pellets are typically single phase materials (to the detectability limits of standard powder x-ray diffraction) of the $GaInO_3$ structure type. Air is selected as an ambient for the initial processing steps because of its convenience. Covers are placed over the crucibles as a precaution to prevent evaporation of the oxides, but we have not observed evaporation under the conditions described. The first air firing need not necessarily be in the 1100°-1200° C. range, but we select an initial low temperature to reduce the possibility of metastable melting. The final heating temperature of 1300° C. in air gave more satisfactory conductivities, in one set of experiments, than did a 1400° C. air treatment. The times and temperatures of these treatments are expected to be dependent on the reactivities of the starting materials and the efficiencies of the grinding operations. Shorter times can be expected to give equally satisfactory results, for example, in the preparation of ceramic targets for sputtering or laser ablation.

The material after air firings are not in their optimally conducting state. A further treatment is advantageous to improve the conductivity. In this treatment, a heating of duration 10-12 hours in flowing $N_2$ (approximately 100 cc/min, $N_2$ typically approximately 50-100 ppm $O_2$) in a ceramic tube furnace at 1200° C. is employed, again with the pellets allowed to cool at the natural furnace cooling rate. Covered aluminum oxide crucibles and a powder bed for the pellets need not necessarily be employed for this step. The pellets emerge from the $N_2$ treatment with good electrical conductivity and a light grey-to-white color.

EXAMPLE 2

Processing conditions as described in Example 1, with $Ga_2O_3$, $GeO_2$, and $In_2O_3$ mixed in appropriate mole ratios to yield $Ga_{1-x}Ge_xInO_3$. For example for $Ga_{0.92}Ge_{0.08}InO_3$ in a 5 gram batch, 1.8470 grams of $Ga_2O_3$, 0.1792 grams of $GeO_2$ and 2.9737 grams of $In_2O_3$ are employed.

EXAMPLE 3

Processing conditions as described in Example 1, with $Ga_2O_3$, $In_2O_3$ and $SnO_2$ mixed in appropriate mole ratios to yield $Ga_{1-x}Sn_xInO_3$. For example, for $Ga_{0.96}Sn_{0.04}InO_3$ in a 5 gram batch, 1.9158 grams of $Ga_2O_3$, 0.1283 grams of $SnO_2$ and 2.9559 grams of $In_2O_3$ are employed.

EXAMPLE 4

Processing conditions as described in Example 1, with $Ga_2O_3$, $In_2O_3$ and $TiO_2$ (titanium dioxide) mixed in appropriate mole ratios to yield $GaIn_{1-x}Ti_xO_3$. For example for $GaIn_{0.96}Ti_{0.04}O_3$ in a 5 gram batch, 2.0358 grams of $Ga_2O_3$, 0.0694 grams of $TiO_2$, and 2.8948 grams of $In_2O_3$ are employed.

EXAMPLE 5

Processing conditions as described in Example 1, with $Ga_2O_3$, $In_2O_3$ and $SiO_2$ (silicon dioxide) mixed in appropriate mole ratios to yield $Ga_{1-x}Si_xInO_3$.

EXAMPLE 6

Processing conditions as described in Example 1, with $Ga_2O_3$, $In_2O_3$, $GeO_2$ and $SnO_2$ mixed in appropriate mole ratios to yield $Ga_{1-x}Ge_xIn_{1-y}Sn_yO_3$.

EXAMPLE 7

Processing conditions as described in Example 1 except that after firing the pellets are heated in a nitrogen-hydrogen (15 mole percent hydrogen) ambient rather than in $N_2$, and at a temperature of 600°-650° C. rather than 1200° C. This process produced conductivity of 2 milliohm cm, the highest thus far observed in bulk doped $GaInO_3$.

EXAMPLE 8

Alternatively, for applications which do not require the highest conductivity, pellets of undoped $GaInO_3$ after firing can be heated in a reducing ambient (e.g. nitrogen-hydrogen (15 mole percent hydrogen) at 600°-650° C.). Such targets produce conductive films. It is believed that they are effectively doped by oxygen vacancies.

B. Substrates Coated With Conductively Doped $GaInO_3$

Figure 2:
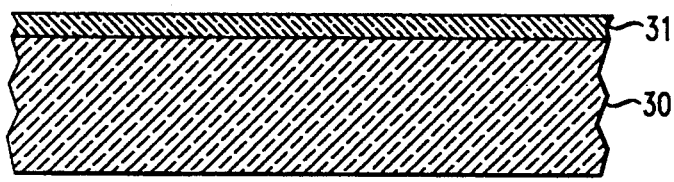
FIG. 2 is a schematic cross section of a substrate coated with conductively doped $GaInO_3$.

It is contemplated that a basic use of conductively doped $GaInO_3$ is providing transparent coatings on substrates such as glass, semiconductor or plastic. For example, the ability of the material to transmit light of any wavelength from 0.4 $\mu$m to 1.1 $\mu$m makes it useful as a coating material for windows, solar cells or display devices. Such coated substrates permit selective entry of visible light while reflecting ultraviolet and infrared. FIG. 2 is a schematic cross section of a substrate 30, such as a transparent glass, coated with a thin layer 31 comprising conductively doped $GaInO_3$. Preferably the coating is in the form of a thin continuous polycrystalline layer having a thickness typically in the range 0.1 $\mu$m to 1 $\mu$m.

The method for coating a substrate 30 can be understood by considering the following examples.

EXAMPLE 9

(Deposition By Laser Ablation)

A pressed pellet of $Ga_{0.9}Ge_{0.1}InO_3$ was placed in the target holder of a pulsed laser deposition vacuum chamber and a vitreous quartz substrate was mounted onto a heatable substrate holder facing the target and positioned about 8 cm from the target. The chamber was evacuated to a base pressure of $1-10\times10^{-7}$ Torr and 1 m Torr of oxygen was bled into the chamber. The substrate was heated to 250° C., and then the target was bombarded by pulses from a KrF excimer laser operating at 248 nm with a pulse repetition rate at 10 Hz. The energy density of the laser on target was 1-4 J/cm². The deposition rate was 1000-1500 angstroms per hour. After growth of several thousand angstroms, the chamber was again evacuated and the substrate was permitted to cool to room temperature. The films subsequently removed from the chamber were transparent to the eye with good electrical conductivity.

EXAMPLE 10

(Deposition By Sputtering)

A pressed pellet of $Ga_{1-x}Sn_xInO_3$ was placed in the target holder of a dc magnetron sputter deposition chamber. Corning glass and fused silica substrates were placed in proximity to the target in two configurations: (1) on-axis geometry directly underneath the target and (2) off-axis geometry outside the plasma plume, approximately 0.5-2.0 cm from the edge of the sputtering gun. The chamber was evacuated, and a sputtering gas consisting of an argon-oxygen mixture (15-1 ratio) at 4-20 m Torr was introduced. The substrate was heated to 250° C.-500° C. The target was then impacted by the sputter gun (a US 1" magnetron source) operating at a dc voltage of 350 V, a current of 0.78 A, and a power level of 25 Watts. The growth rate was about 1.3 $\mu$m per hour in the on-axis geometry and 0.25 to 0.5 $\mu$m per hour in the off-axis geometry. The films had resistivity of about 2.5 milliohm-cm in a 0.4 micrometer thick film and exhibited transmission superior to indium tin oxide in the green and blue regions.

Figure 3:
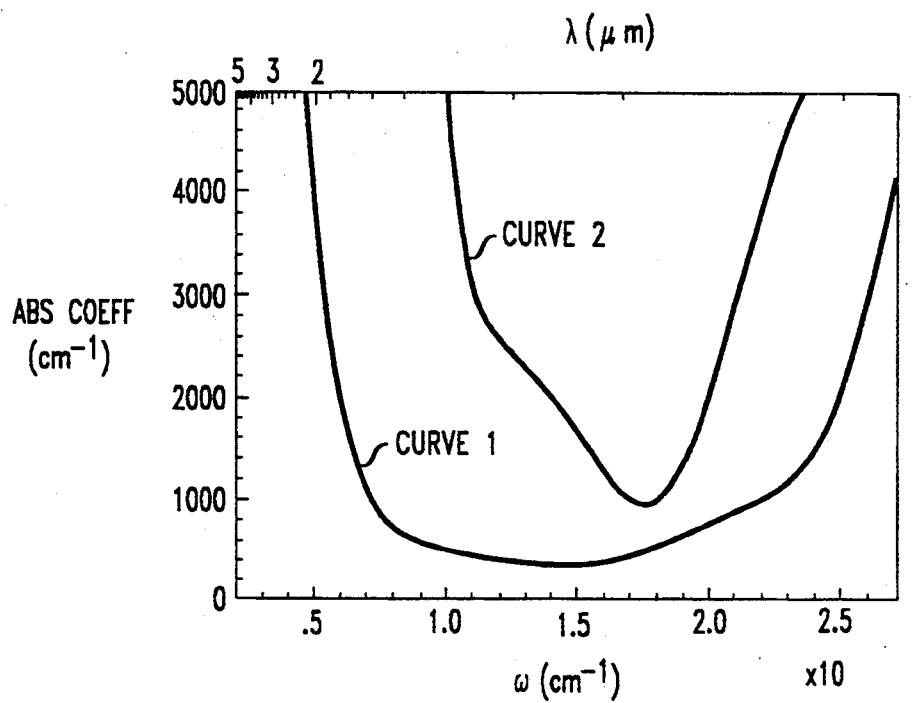
FIG. 3 is a graphical display of absorption versus wavelength for conductively doped $GaInO_3$ in comparison with conventional ITO.

FIG. 3 is a graphical illustration of the absorption spectrum of conductively doped $GaInO_3$ (curve 1) in comparison with that of conventional ITO (curve 2). As can be seen, the $GaInO_3$ film exhibits uniformly small absorption across the visible spectrum.

It is to be understood that the above-described embodiments are illustrative of only a few of the many possible specific embodiments of the invention. Numerous and varied other arrangements can be made by those skilled in the art without departing from the spirit and scope of the invention.

I claim:

1. A transparent conductive material comprising $GaInO_3$ doped with an aliovalent material having a valence greater than 3, wherein said aliovalent material is other than Ga or In, and wherein said aliovalent material has a valence different than Ga or In.

2. The composition of matter comprising $GaInO_3$ doped to a resistivity less than 10 milliohm-cm with an aliovalent material having a valence greater than 3, wherein said aliovalent material is other than Ga or In, and wherein said aliovalent material has a valence different than Ga or In.

3. The composition of matter comprising $GaIn_{1-x}M_xO_3$ where M is an aliovalent material having a valence greater than 3 and $0.005 \leq x \leq 0.12$, and wherein said aliovalent material is other than Ga or In, and wherein said aliovalent material has a valence different than Ga or In.

4. The composition of matter comprising $Ga_{1-x}M_xInO_3$ where M is an aliovalent material having a valence greater than 3 and $0.005 \leq x \leq 0.12$, and wherein said aliovalent material is other than Ga or In, and wherein said aliovalent material has a valence different than Ga or In.

5. The composition of claim 2 or 3 or 4 wherein said aliovalent material is a tetravalent material.

6. The transparent conductive material of claim 1 wherein said aliovalent material is a tetravalent material.

7. The composition of matter comprising $Ga_{1-x}M_xIn_{1-y}M'_yO_3$ where M and M' are aliovalent materials having valences greater than 3, wherein said aliovalent materials are other than Ga or In, and wherein said aliovalent materials have a valence different than Ga or In.

8. The composition of claim 7 where M is Ge and M' is Sn.

9. The composition of matter comprising $Ga_{1+x-}In_{1-x-y}M_yO_3$ where M is an aliovalent material having a valence greater than 3, $0.25 \geq x$ and $0.005 \leq y \leq 0.12$, and wherein said aliovalent material is other than Ga or In, and wherein said aliovalent material has a valence different than Ga or In.

10. The composition of matter comprising $Ga_{1+x-y}M_yIn_{1-x}O_3$ where M is an aliovalent material having a valence greater than 3, $0.25 \geq x$ and $0.005 \leq y \leq 0.12$, and wherein said aliovalent material is other than Ga or In, and wherein said aliovalent material has a valence different than Ga or In.

11. The composition of claim 1 or 2 or 3 or 4 or 6 or 7 or 9 or 10 wherein the dopant material comprises a material from the group consisting of tin, germanium, silicon, niobium and titanium.

* * * * *